United States Patent
Barth et al.

(10) Patent No.: US 6,548,961 B2
(45) Date of Patent: Apr. 15, 2003

(54) ORGANIC LIGHT EMITTING DEVICES

(75) Inventors: Siegfried Johannes Barth, Marburg (DE); Tilman A. Beierlein, Kilchberg (CH); Siegfried F. Karg, Adliswil (CH); Heike Riel, Rueschlikon (CH); Walter Heinrich Riess, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/887,780

(22) Filed: Jun. 22, 2001

(65) Prior Publication Data

US 2002/0195961 A1 Dec. 26, 2002

(51) Int. Cl.[7] .................................................. G09G 3/10
(52) U.S. Cl. ................................ 315/169.3; 315/169.1; 313/506; 257/40
(58) Field of Search ............................. 315/169.3, 169.1; 313/491, 495, 506, 509, 505, 512; 257/40, 684–686; 345/48; 428/690

(56) References Cited

U.S. PATENT DOCUMENTS

| | | | |
|---|---|---|---|
| 5,929,474 A | * 7/1999 | Huang et al. | 257/114 |
| 6,316,786 B1 | * 11/2001 | Mueller et al. | 257/40 |
| 6,322,712 B1 | * 11/2001 | Hanson et al. | 205/251 |
| 6,370,019 B1 | * 4/2002 | Matthies et al. | 313/422 |

* cited by examiner

Primary Examiner—Haissa Philogene
(74) Attorney, Agent, or Firm—Robert M. Trepp; Ohlandt, Greeley, Ruggiero & Perle, L.L.P.

(57) ABSTRACT

A method of making a light-emitting device comprises forming a first and second components. The first component has a light-transmissive first substrate, light transmissive first electrode layer on the first substrate, an organic layer on the first electrode, and a second electrode layer on the organic layer. The second component has a second substrate and driver array circuitry on the second substrate. The first component and the second component are joined together with the second electrode of the first component facing the driver array of the second component. An electrical contact is formed between one of the first and second electrode layers of the first component and the driver array circuitry of the second component.

12 Claims, 2 Drawing Sheets

ORGANIC LIGHT EMITTING DEVICES

FIELD OF INVENTION

The present invention relates to organic light emitting devices for display applications and to methods for fabricating such devices.

BACKGROUND

Organic light-emitting devices (OLEDs) are typically manufactured as a sequence of layers deposited on top of each other to form a layer structure. The layer structure typically comprises a first electrode on a supporting substrate and one or more organic layers disposed between the first electrode and a second electrode. Light output is generated by charge injection into the organic material via the electrodes. The organic material emits photons on excitation by the injected charge. At least one of the electrodes is typically formed from a light transmissive material such as Indium Tin Oxide (ITO) or a thin metal to permit passage of light out of the device. Light transmissive materials should be understood to include both transparent and semi-transparent materials.

If the OLED is driven by a thin film transistor (TFT) array, then part of the light emitted from the organic material can be shadowed by the TFT array. The ratio of area occupied by the TFT array to the light emissive area of the display is generally referred to as the aperture ratio. Clearly, it would be desirable to maximize the aperture ratio in the interests of optimizing the brightness of the display/efficiency. However, the higher the resolution of the display, the smaller the aperture ratio.

SUMMARY OF THE INVENTION

In accordance with the present invention, there is now provided a method of making a light-emitting device comprising: forming a first component having a light-transmissive first substrate, the forming of the first component comprising locating a light transmissive first electrode layer on the first substrate, locating an organic layer on the first electrode, and locating a second electrode layer on the organic layer; forming a second component having a second substrate, the forming of the second component comprising locating driver array circuitry on the second substrate; joining the first component and the second component with the second electrode of the first component facing the driver array of the second component; and, forming an electrical contact between one of the first and second electrode layers of the first component and the driver array circuitry of the second component.

Spacers are preferably located between the first component and the second component. At least one of the spacers may be formed on the driver array of the second component. Equally however, at least one of the spacers may be formed on the first electrode layer of the first component. The or each spacer formed on the first electrode layer may be partially covered by the organic layer. Similarly, the or each spacer formed on the first electrode layer may be partially covered by the second electrode layer. At least one of the spacers may be formed on the second electrode layer of the first component. The spacers may be electrically conductive to form an electrical contact between one of the first and second electrode layers of the first component and the driver array circuitry of the second component. Alternatively, the spacers may be electrically insulating, particularly when they are located on the first electrode layer beneath the organic layer and the second electrode layer. The first component and the second component are preferably joined by forming a peripheral seal between the first component and the second component and creating a vacuum within the peripheral seal.

Viewing the present invention from another aspect, there is now provided a light-emitting device comprising: a first component having a light-transmissive first substrate, a light-transmissive first electrode layer on the first substrate, an organic layer on the first electrode layer, and a second electrode layer on the organic layer; a second component having a second substrate and driver array circuitry on the second substrate; means for joining the first component and the second component with the second electrode of the first component facing the conductive layer of the second component; and, an electrical contact for electrically connecting one of the first and second electrode layers of the first component and the driver array circuitry of the second component The device preferably comprises spacers distributed between the first component and the second component. At least one of the spacers is preferably integral to the first component. The, or each, spacer of the first component may be disposed on the first electrode layer. The, or each, spacer of the first component may be partially covered by the organic layer. Likewise, the, or each, spacer of the first component may be partially covered by the second electrode. Alternatively, the, or each, spacer of the first component may be disposed on the second electrode. At least one of the spacers may be integral to the second component. The first component may comprise a plurality of organic layers disposed between the first electrode and the second electrode. The joining means preferably comprises a peripheral seal between the first component and the second component, and a vacuum is disposed within the peripheral seal.

In a preferred embodiment of the present invention to be described shortly, there is provided an OLED having a TFT driver array for large area display applications and a method for making the same. The example of an OLED described herein comprises two components. The first component has a light transmissive substrate carrying an organic layer. A light transmissvie first electrode layer is disposed between the organic layer and substrate. A second electrode layer is disposed on the surface of the organic layer remote from the substrate. The second electrode layer comprises a thin semitransparent metal electrode layer (<20 nm) in intimate electrical contact with an underlying organic layer to provide uniform charge injection in the interests of optimizing display output. The metal layer can be formed from any metal or combination of metals. The second component carries a TFT driver array. The first and second components are superimposed on each other with contacts the TFT array of the of the second component overlying and in electrical contact with contacts to the second electrode of the first component. Light generated in the organic layer is emitted via the first electrode and the substrate of the first component. Thus, the light output from the OLED is not obstructed by the TFT array. The aperture ratio of the display can thus be up to one hundred per cent. Another advantage is that, by forming the OLED in multiple components, each component can be optimized separately in terms of, for example, transparency, conductivity, low damage, injection efficiency, processing speed. Spacers are preferably provided between the first and second components to reduce the risk of mechanical damage when the first and second components of the OLED are brought together. Additionally, the spacers improve the mechanical stability of the OLED.

BRIEF DESCRIPTION OF THE DRAWINGS

Preferred embodiments of the present invention will now be described, by way of example only, with reference to the accompanying drawings, in which.

DETAILED DESCRIPTION OF A PREFERRED EMBODIMENT

Figure 1:
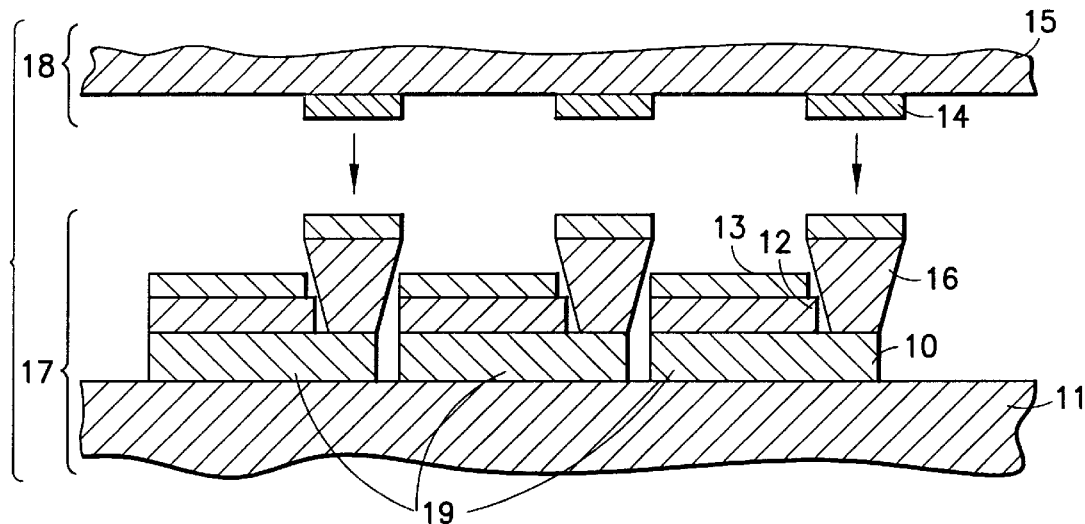
FIG. 1 is a cross-sectional exploded view of an example of an OLED embodying the present invention.

Referring first to FIG. 1, an example of an OLED embodying the present invention comprises a first substrate 11 and a second substrate 15. The first substrate 11 is formed from a light transmissive material such as glass or plastics. The second substrate 15 may be formed from a light transmissive material such as glass or plastics or from an opaque material such as a Silicon wafer. The second substrate 15 comprises an active matrix TFT driver array 14.

A light transmissive first electrode layer 10 of electrically conductive material is disposed on the first substrate 11. The first electrode layer 10 is divided into an array of addressable first electrode elements 19. Each first electrode element 19 corresponds to a different TFT driver in the TFT array 14. The first electrode layer may formed from a range of materials including but not limited to organic conductors such as polyaniline, polythiophene and derivatives thereof, and Indium Tin Oxide and light transmissive metals, for example.

An organic layer 12 is disposed on each first electrode element 19. The organic layer 12 comprises active components which are emissive of light when electrically stimulated. These active components may be relatively small organic molecules or organic polymers such as a poly(phenylene vinylene). The organic layer 12 may comprise a single layer of organic material. However, in particularly preferred embodiments of the present invention, the organic layer 12 comprises a composite organic layer including a stack of organic and inorganic layers.

A second electrode layer 13 is disposed on the organic layer 12 overlying each first electrode element 19. The second electrode layer 13 may be formed from a range of different materials, including but not limited to Indium Tin Oxide, Indium Zinc Oxide, Aluminum Zinc Oxide, Aluminum, Nickel, Copper, Platinum, and Iridium, or combinations of the aforementioned materials with organic and/or inorganic charge injection layers.

The first substrate 11, together with the first electrode layer 10, organic layer 12, and second electrode layer 13, collectively form a first self-supporting component 17. Likewise, the second substrate 15 and the TFT array 14 collectively form a second self-supporting component 18. The first component further comprises an array of electrically conductive spacers 16. Each spacer 16 is in electrical contact with, and extends from, a different first electrode element 19. However, the spacers 16 are electrically isolated from the organic layer 12 and the second electrode layer 13. Each spacer 16 corresponds to a different TFT driver of the TFT array 14 on the second substrate 15. Specifically, each TFT driver in the second component 18 comprises an output contact pad corresponding to a different spacer 16 of the first component 17.

During manufacture, the first component 17 and the second component 18 are joined together into a composite structure with contact pads of the TFT array 14 facing corresponding spacers 16 of the first component 17. By aligning the contact pads of the TFT array 14 with the corresponding spacers 16 of the first component 17, electrical contacts between the first electrode elements 19 and the corresponding drivers circuits in the TFT array 14 are formed when the first component 17 and the second component 18 are brought together.

Figure 2:
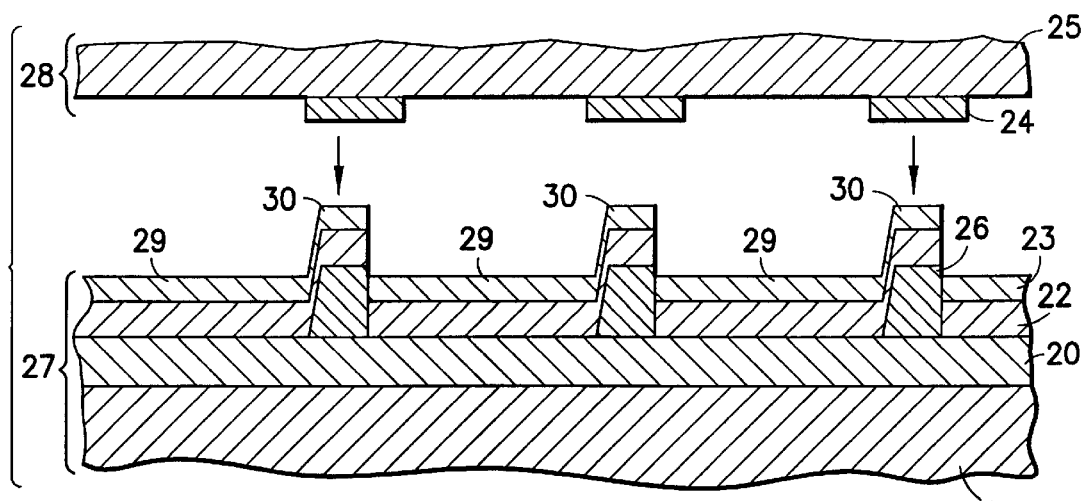
FIG. 2 is a cross-sectional exploded view of another example of an OLED embodying the present invention.

Turning now to FIG. 2, another example of an OLED embodying the present invention comprises a first substrate 21 and a second substrate 25. The first substrate 21 is formed from a light transmissive material such as glass or plastics. The second substrate 25 may be formed from a light transmissive material such as glass or plastics or from an opaque material such as a Silicon wafer. The second substrate 25 comprises an active matrix TFT driver array 24.

A light transmissive first electrode layer 20 of electrically conductive material is disposed on the first substrate 21. The first electrode layer 20 may formed from a range of materials including but not limited to organic conductors such as polyaniline, polythiophene and derivatives thereof, and Indium Tin Oxide and light transmissive metals, for example.

An organic layer 22 is disposed on the first electrode layer 20. The organic layer 22 comprises active components which are emissive of light when electrically stimulated. These active components may be relatively small organic molecules or organic polymers such as a poly(phenylene vinylene). The organic layer 22 may comprise a single layer of organic material. However, in particularly preferred embodiments of the present invention, the organic layer 22 comprises a composite organic layer including a stack of organic and inorganic layers.

A second electrode layer 23 is disposed on the organic layer 22. The second electrode layer 23 is divided into an array of addressable second electrode elements 29. Each second electrode element 29 corresponds to a different TFT driver in the TFT array 24. The second electrode layer 23 may be formed from a range of different materials, including but not limited to Indium Tin Oxide, Indium Zinc Oxide, Aluminum Zinc Oxide, Aluminum, Nickel, Copper, Platinum, and Iridium, or combinations of the aforementioned materials with organic and/or inorganic charge injection layers.

The first substrate 21, together with the first electrode layer 20, organic layer 22, and second electrode layer 23, collectively form a first self-supporting component 27. Likewise, the second substrate 25 and the TFT array 24 collectively form a second self-supporting component 28. The first component 27 further comprises an array of light transmissive and electrically insulating spacers 26 disposed on the first electrode layer 20. Each spacer 26 corresponds to a different second electrode element 29. Also, each second electrode element 29 has a raised portion 30 overlying the organic layer 23 and the corresponding spacer 26. Each spacer 26 corresponds to a different TFT driver of the TFT array 24 on the second substrate 25. Specifically, each TFT driver in the second component 28 comprises an output contact pad corresponding to a different spacer 26 of the first component 27. The spacers 26 provide electrical isolation between adjacent divisions of the organic layer 22 and the second electrode layer 23.

During manufacture, the first component 27 and the second component 28 are joined together into a composite structure with contact pads of the TFT array 24 facing corresponding spacers 26 of the first component 27. By aligning the contact pads of the TFT array 24 with the corresponding spacers 26 of the first component 27, electrical contacts between the raised portions 30 of the second electrode elements 29 and the corresponding driver circuits in the TFT array 24 are formed when the first component 27 and the second component 28 are brought together.

Figure 3:
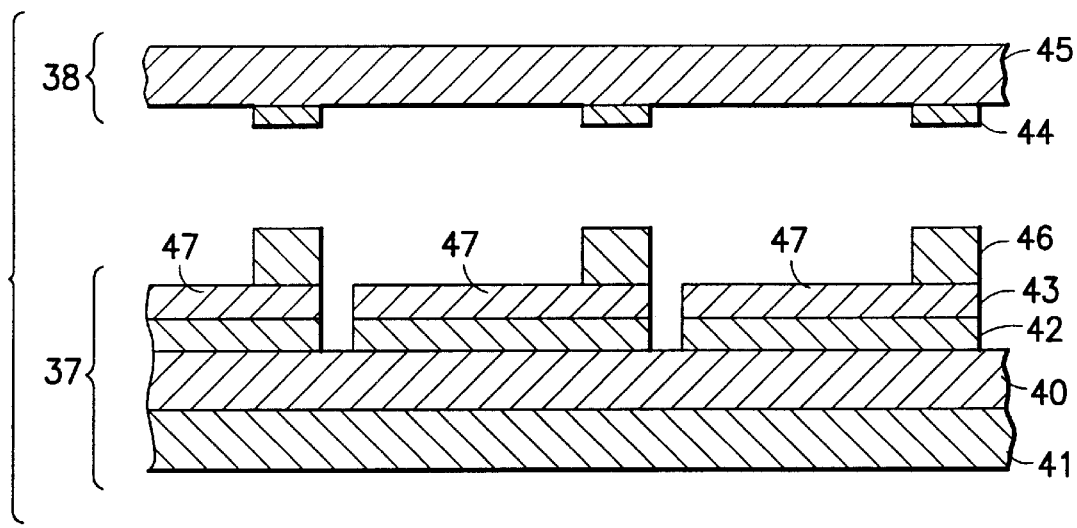
FIG. 3 is a cross-sectional exploded view of yet another example of an OLED embodying the present invention; and, FIG. 4 is another cross-sectional view of an OLED embodying the present invention.

Wither reference to FIG. 3, another example of an OLED embodying the present invention comprises a first substrate 41 and a second substrate 45. The first substrate 41 is formed from a light transmissive material such as glass or plastics. The second substrate 45 may be formed from a light transmissive material such as glass or plastics or from an opaque material such as a Silicon wafer. The second substrate 45 comprises an active matrix TFT driver array 44.

A light transmissive first electrode layer 40 of electrically conductive material is disposed on the first substrate 41. The first electrode layer 40 may formed from a range of materials including but not limited to organic conductors such as polyaniline, polythiophene and derivatives thereof, and Indium Tin Oxide and light transmissive metals, for example.

An organic layer 42 is disposed on the first electrode layer 40. The organic layer 42 comprises active components which are emissive of light when electrically stimulated. These active components may be relatively small organic molecules or organic polymers such as a poly(phenylene vinylene). The organic layer 42 may comprise a single layer of organic material. However, in particularly preferred embodiments of the present invention, the organic layer 42 comprises a composite organic layer including a stack of organic and inorganic layers.

A second electrode layer 43 is disposed on the organic layer 42. The second electrode layer 43 and the organic layer 42 are divided into an array of addressable elements 47 with each element electrically isolated from the surrounding elements. Each element 47 corresponds to a different TFT driver in the TFT array 44. The second electrode layer 43 may be formed from a range of different materials, including but not limited to Indium Tin Oxide, Indium Zinc Oxide, Aluminum Zinc Oxide, Aluminum, Nickel, Copper, Platinum, and Iridium, or combinations of the aforementioned materials with organic and/or inorganic charge injection layers.

The first substrate 41, together with the first electrode layer 40, organic layer 42, and second electrode layer 43, collectively form a first self-supporting components 37. Likewise, the second substrate 45 and the TFT array 44 collectively form a second self-supporting component 38. The first component 37 further comprises an array of electrically conductive spacers 46 disposed on the second electrode layer 43. Each spacer 46 corresponds to a different element 47 and to a different TFT driver of the TFT array 44 on the second substrate 45. Specifically, each TFT driver in the second component 38 comprises an output contact pad corresponding to a different spacer 46 of the first component 37.

During manufacture, the first component 37 and the second component 38 are joined together into a composite structure with contact pads of the TFT array 44 facing corresponding spacers 46 of the first component 37. By aligning the contact pads of the TFT array 44 with the corresponding spacers 46 of the first component 37, electrical contacts between the second electrode layer 43 of the elements 47 and the corresponding driver circuits in the TFT array 44 are formed when the first component 37 and the second component 38 are brought together.

In the embodiment of the present invention hereinbefore described with reference to FIG. 1, the spacers 16 are integral to the first component 17. However, it will be appreciated that in modifications to this embodiments of the present invention, the spacers 16 may be integral to the second component 18. In such embodiments, the spacers 16 effectively extend the contact pads of the TFT array towards the first component 17. With reference again to FIG. 2, it will also be appreciated that, in modification to this embodiment of the present invention, the spacers 26 may form part of the second component 28 instead of the first component 27. Similarly, with reference again to FIG. 3, it will likewise be appreciated that, in modification to this embodiment of the present invention, the spacers 46 may form part of the second component 38 instead of the first component 37.

Figure 4:
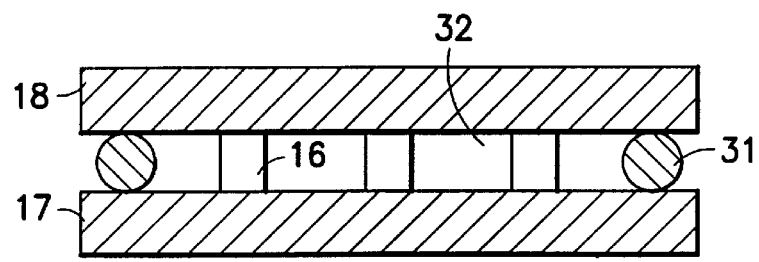

Referring back to FIG. 1, it will be appreciated that many methods and configurations for joining the first component 17 and the second component 18 together are possible. For example, referring now to FIG. 4, in a particularly preferred embodiment of the present invention the first component 17 and the second component 18 are secured together by introducing a peripheral seal 31 extending around the edges of the first component 17 and the second component 18. The seal 31, the first component 17, and the second component 18 thus define an interior space 32. The interior space 32 is then evacuated thereby urging the first component 17 and the second component 18 together. It will also be appreciated that many methods and configurations for aligning the first component 17 relative to the second component 18 are possible. For example, locating lugs or similar formations may be provided on the component receiving the spacers 16 for keying with the spacers 16 to align the first component 17 and the second component 18 during assembly of the OLED. Similarly, it will be appreciated that the spacers 16 may be distributed between the first component 17 and the second component 18. For example, the spacers 16 may be alternately located on the first component 17 and the second component 18. It will be further appreciated that the joining techniques hereinbefore described with reference to FIG. 1 are equally applicable to the OLEDs described herein with reference to FIGS. 2 and 3.

What is claimed is:

1. A method of making a light-emitting device comprising:

forming a first component having a light-transmissive first substrate, the forming of the first component comprising locating a light transmissive first electrode layer on the first substrate, locating an organic layer on the first electrode, and locating a second electrode layer on the organic layer;

forming a second component having a second substrate, the forming of the second component comprising locating driver array circuitry on the second substrate;

joining the first component and the second component with the second electrode of the first component facing the driver array of the second component;

forming an electrical contact between one of the first and second electrode layers of the first component and the driver array circuitry of the second component;

locating spacers between the first component and the second component, the locating forming at least one of the spacers on the first electrode layer of the first component; and partially covering the, or each, spacer formed on the first electrode layer with the organic layer.

2. A method as claimed in claim 1, comprising forming at least one of the spacers on the driver array of the second component.

3. A method as claimed in claim 1, comprising partially covering the, or each, spacer formed on the first electrode layer with the second electrode layer.

4. A method as claimed in claim 1, comprising forming at least one of the spacers on the second electrode layer of the first component.

5. A method as claimed in claim 1, wherein the spacers are electrically insulating.

6. A method as claimed in claim 1, wherein the joining of the first component and the second component comprises forming a peripheral seal between the first component and the second component and creating a vacuum within the peripheral seal.

7. A light-emitting device comprising:
   a first component having a light-transmissive first substrate, a light-transmissive first electrode layer on the first substrate, an organic layer on the first electrode layer, and a second electrode layer on the organic layer;
   a second component having a second substrate and driver array circuitry on the second substrate;
   means for joining the first component and the second component with the second electrode of the first component facing the conductive layer of the second component;
   an electrical contact for electrically connecting one of the first and second electrode layers of the first component and the driver array circuitry of the second component; and
   spacers distributed between the first component and the second component, at least one of the spacers being integral to the first component and disposed on the first electrode layer thereof and partially covered by the organic layer.

8. A device as claimed in claim 7, wherein the, or each, spacer of the first component is partially covered by the second electrode.

9. A device as claimed in claim 7, wherein at least one of the spacers is integral to the second component.

10. A device as claimed in claim 7, wherein the spacers are electrically insulating.

11. A device as claimed in claim 7, wherein the first component comprises a plurality of organic layers disposed between the first electrode and the second electrode.

12. A device as claimed in claim 7, wherein the joining means comprises a peripheral seal between the first component and the second component and a vacuum is disposed within the peripheral seal.

* * * * *